United States Patent [19]

Hutson

[11] 3,821,782

[45] June 28, 1974

[54] HIGH VOLTAGE SEMICONDUCTOR DEVICE WITH PLURAL GROOVES

[76] Inventor: Jearld L. Hutson, P.O. Box 34235, Dallas, Tex. 75234

[22] Filed: Sept. 4, 1973

[21] Appl. No.: 394,093

Related U.S. Application Data

[63] Continuation of Ser. No. 106,436, Jan. 14, 1971.

[52] U.S. Cl. .................... 357/55, 354/73, 354/49, 354/38, 354/52, 354/56

[51] Int. Cl. .......................... H01l 5/00, H01l 11/10

[58] Field of Search. 317/235 AG, 235 AJ, 235 AK, 317/235 AB, 235 F, 234 F; 29/413, 580, 583; 225/2; 156/11, 17

[56] References Cited

UNITED STATES PATENTS

| | | | |
|---|---|---|---|
| 2,929,999 | 3/1960 | Bradley et al. | 317/235 AJ |
| 3,519,506 | 7/1970 | Topas | 317/235 AJ |
| 3,559,006 | 1/1971 | Otsuka et al. | 317/235 AB |
| 3,575,644 | 4/1971 | Huth et al. | 317/235 AB |
| 3,601,666 | 8/1971 | Leedy et al. | 317/235 AJ |
| 3,608,186 | 9/1971 | Hutson | 317/235 AJ |
| 3,639,815 | 2/1972 | Ernick et al. | 317/235 AJ |
| 3,699,402 | 10/1972 | McCann et al. | 317/235 AB |
| 3,735,483 | 5/1973 | Sheldon | 317/235 AJ |

*Primary Examiner*—Rudolph V. Rolinec
*Assistant Examiner*—William D. Larkins
*Attorney, Agent, or Firm*—Richards, Harris & Medlock

[57] ABSTRACT

A semiconductor device that comprises a body of semiconductor material having first and second continuous grooves in first and second opposite surfaces at the periphery thereof, respectively, in which the combined depths of the two grooves are substantially equal to or greater than the thickness of the body between the opposite surfaces. The grooves are offset or laterally spaced apart, with the surfaces thereof being etched smooth so that the electric field is not distorted at the edge of the device.

10 Claims, 15 Drawing Figures

*INVENTOR*
JEARLD L. HUTSON

Thomas A. Harwood

*ATTORNEY*

INVENTOR
JEARLD L. HUTSON
Thomas G. Harwood
ATTORNEY

INVENTOR

JEARLD L. HUTSON

Thomas A. Harwood

ATTORNEY

HIGH VOLTAGE SEMICONDUCTOR DEVICE WITH PLURAL GROOVES

This application is a continuation of the application of Jearld L. Hutson, Ser. No. 106,436, filed Jan. 14, 1971.

This invention relates to semiconductor devices, and more particularly to semiconductor devices having high reverse, blocking voltage characteristics.

The semiconductor industry continually devotes an effort to develop devices that are capable of operating at increased voltages. Higher voltage operating characteristics are especially important for various power devices such as diodes, semiconductor controlled rectifiers, triacs and other devices that must block large reverse voltages.

A factor that must be contended with is the surface effects of the devices as they relate to breakdown above certain reverse voltage magnitudes. It has been found that rough surfaces at the edge of a device cause a distortion of the electric field within the device and a very high field gradient at these edges, causing reverse voltage breakdown at smaller voltages than desired. On the other hand, a surface that is smooth such as prepared by etching tends to eliminate the surface effects of the electric field, thus permitting operation of the device at higher reverse voltages.

Up until this time, the industry could reproducibly manufacture in quantity power devices that could operate only up to about 800 volts. The primary reason why the industry could not effectively increase the voltage rating was because of certain constraints under which the devices were manufactured that prevented preparing the surfaces that affected the reverse voltage characteristics. In particular many devices are produced from a single semiconductor wafer or slice during a process, and must ultimately be separated out as units. The separation is effected by breaking the wafer along etched grooves or by sawing along prescribed lines. The break or sawed surface is rough and is characterized by sharp points, thus causing very high electric fields to exist over short distances. Thus the edges have to be etched to smooth them. It is impractical in many processes to etch the individual units after they are separated out, however. For example, the units are plated for soldering prior to separation, thus requiring masking of the plated surface before etching so that it is not destroyed. This is ofter impractical and costly. As another example, many devices are glass passivated, with the glass also being applied to the surface of the device prior to the separation process. Later etching also damages the glass passivation layers.

The present invention virtually eliminates the problem of rough edges surfaces that are created during separation of a device from the wafer, thus yielding a device that has a much greater reverse voltage blocking capability. This is accomplished by providing etched grooves adjacent the periphery of the device in both top and bottom surfaces, with the grooves being spaced laterally from each other. The etched surfaces of the grooves provide a smooth surface that prevents electric field distortion even though the edge of the device just outside of the grooves is rough as a result of sawing or breaking. By laterally offsetting the grooves, the combined depths thereof can be made at least equal to or greater than the thickness of the device. Thus an etched surface is provided adjacent the edge at every depth throughout the thickness of the device.

Many other objects, features and advantages of the present invention will become readily apparent from the following detailed description thereof when taken in conjunction with the appended claims and the attached drawing in which like reference numerals refer to like parts throughout the several figures, and in which:

Figure 1:
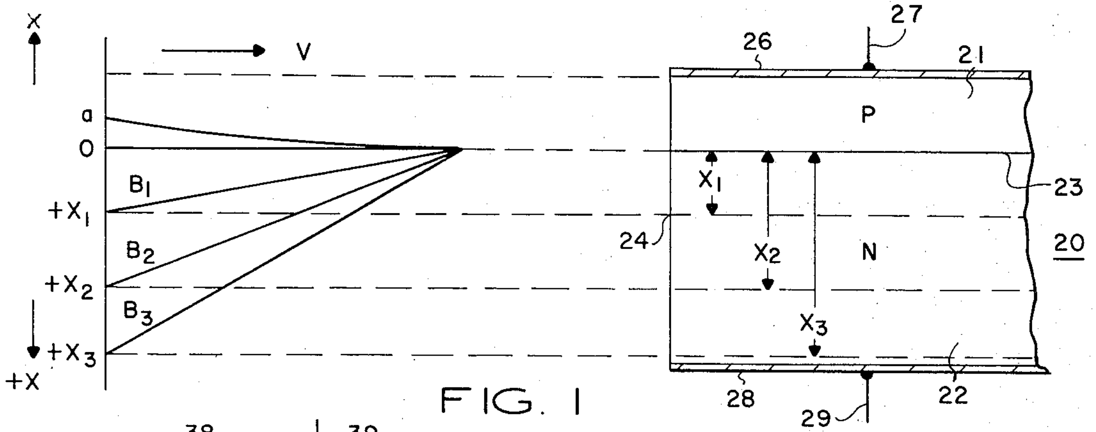
FIG. 1 is a schematic representation of an ideal depletion region profile inside a semiconductor device for several magnitudes of reverse voltage.

A fragmentary view of a semiconductor device 20 is shown in section in FIG. 1 with adjacent P and N type electrical conductivity regions 21 and 22, respectively, separated by a rectifying junction 23. The device includes an electrode 26 attached to region 21 to which an electrical lead 27 is bonded. Another electrode 28 is attached to region 22, and an electrical lead 29 is bonded to this electrode. The drawing represents a diode, for example, in which the junction is effective to block current flow for a reverse bias voltage applied between electrodes 26 and 28 attached to regions 21 and 22, respectively The device shown is illustrated to have an ideally smooth edge 24 about the periphery thereof.

A smooth edge is achieved as a practical matter during a manufacturing process by etching in an acid solution. This is necessary to achieve a smooth edge since many individual devices are produced in a single wafer, and the individual devices are separated from the wafer by sawing or breaking. This well known separation process results in a rough edge that must by etched if a smooth edge surface is to be obtained.

A graphical representation of the depletion region produced in region 22 for several different reverse voltages is also shown in FIG. 1. Region 22 characteristically has a relatively high electrical resistivity, whereas region 21 is highly doped and has a high electrical conductivity. For a reverse bias voltage $B_1$ applied between electrodes 26 and 28 (negative voltage on electrode 26 with respect to electrode 28), the depletion region in region 22 extends a distance of $X_1$ from junction 23. The depletion region in region 21 extends only a short distance a from junction 23 because of the high electrical conductivity of this region. For reverse voltages of higher magnitudes $B_2$ *and* $B_3$, the depletion region extends greater distances $X_2$ and $X_3$, respectively, from junction 23.

For a perfectly smooth edge 24 (ideal case), the depletion region width is the same at the edge as in the interior of the device, and the edge does not distort the electric field in its vicinity. Therefore, the blocking voltage rating of the device, or the reverse voltage magnitude that the device can sustain without breakdown, is governed by parameters of design and material characteristics without reference to or effect by the edge of the device.

Figure 2:
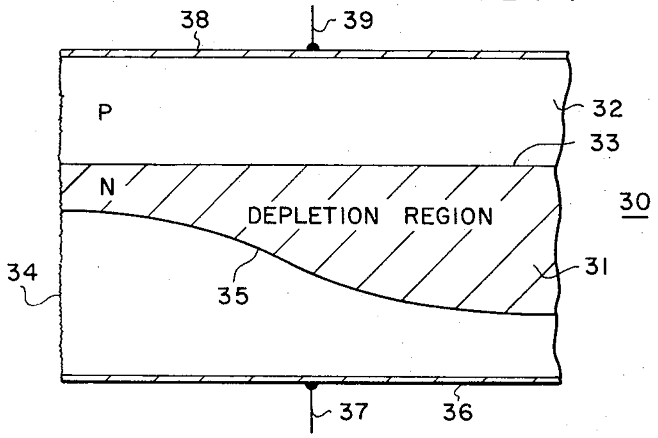
FIG. 2 is a schematic representation of a distorted depletion region profile in a semiconductor device having roughened edges.

FIG. 2 shows an enlarged, fragmentary view of a diode 30, for example, in which the edge 34 around the periphery is rough and uneven due to separation from a wafer by breaking or sawing. Again, the diode includes an N-type conductivity region 31 adjacent a P-type conductivity region having a rectifying junction 33 therebetween. The rough edge 34 is characterized by sharp points and pits. The device also has an electrode 36 attached to retion 31, and an electrical lead 17 bonded to the lead. Similarly, an electrode 38 is attached to region 32 with an electrical lead bonded to this electrode. For any given reverse voltage applied across the device between electrodes 36 and 38, the depletion region in region 31 extending from the junction has a profile 35 (schematically illustrated) that is distorted at or near the edge of the device. The effect at the edge is to cause the reverse voltage drop in cathode 31 to exist over a much shorter distance, thus creating a much higher electric field at the edge than in the interior. It is known that the rough edge distorts the electric field in this manner, so that the device breaks down from a blocking condition at a voltage magnitude lower than would ordinarily be the case for the same voltage drop existing over a greater distance in the interior of the device. The edge can be made smooth by etching to increase the blocking voltage characteristic as noted above.

The rectifying junctions of many devices require protection by glass passivation to prevent other characteristics of the device from becoming degraded. In other words, the junctions are not left exposed at the edge of the device unless they are otherwise protected. In practice, a continuous groove is etched in a surface of the device to cut through the junction, whereby the active junction of the device intersects the groove along the entire length thereof and is entirely circumscribed by the groove. Then, the junction is glass passivated within the groove. Also as a practical matter, the device must be glass passivated before it is separated from the wafer, and etching the device sufficiently after separation from the wafer to effect a smooth edge destroys the glass passivation put on the junction earlier. A similar problem is encountered in plating the device. The devices are plated with a metal before separation from the wafer so that they can be soldered to provide the electrodes. Subsequent etching to the extent required to effect a smooth edge along which the device is sawed or broken also destroys the plated surface. Therefore, it is seen that solving the problem of the edge effects must be accomplished while working under several constraints.

Figure 3:
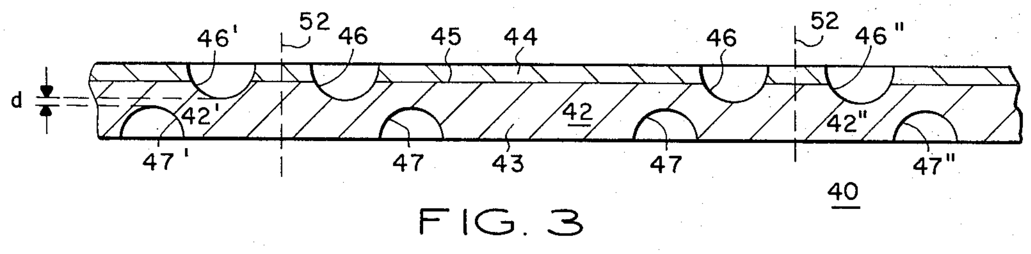
FIG. 3 is a fragmentary end elevational view, in section, of a semiconductor wafer containing several devices made according to one embodiment of the invention.
Figure 4:
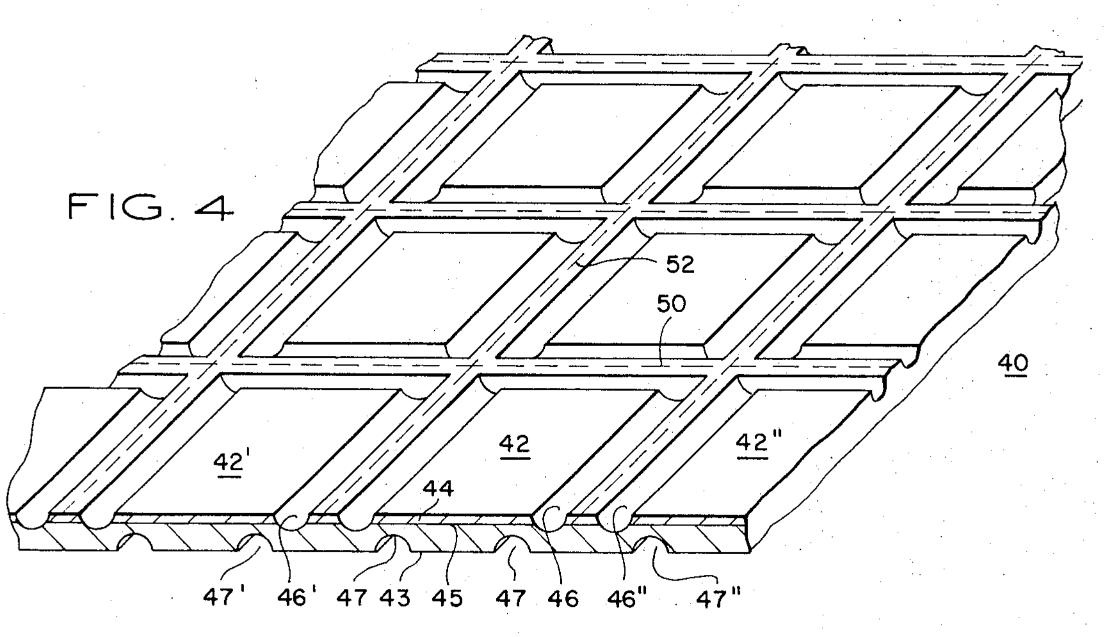
FIG. 4 is a perspective view of the semiconductor wafer shown in FIG. 3.

One embodiment of the invention is shown in FIGS. 3–6. Referring particularly to FIGS. 3 and 4, a semiconductor wafer 40 (shown in end view in FIG. 3 and in perspective view in FIG. 4) includes a device 42 having a first region 43 of one electrical conductivity type with a rectifying junction 45 therebetween. As is seen in FIG. 4, the wafer includes several additional and identical devices 42', 42'', etc. that are eventually separated out from the wafer. The particular devices are diodes, although any other device can be equally considered.

After the region 44 has been formed by diffusion of impurities into the body to create junction 45, a continuous groove 46 is cut in the surface of the body nearest the junction so that the junction is penetrated, as shown. The junction intersects the groove along the entire length thereof so that the active part of the device and junction through which the current flows is completely circumscribed by the groove. The junction is preferably glass passivated in this groove as will be seen hereinafter with respect to some other embodiments, wherein the glass will not be shown in the embodiment for purposes of clarity. Another continuous groove 47 is cut in an opposite face of the device (seen more clearly in FIG. 5) which is laterally offset or spaced from groove 46. Similar grooves 47', 47'', etc. are etched for devices 42', 42'', etc., respectively. In this particular embodiment groove 47 is laterally inside of groove 46, although it can be outside as will be seen later. The lateral spacing between the two grooves is not critical, just so long as they are not so near to each other that the device is structurally weakened to such an extent that it breaks apart. The combined depths of grooves 46 and 47 are slightly less than the thickness of the wafer in this embodiment, although the combined depths can be equal to or greater than the wafer thickness as will be seen hereinafter. The surfaces of both grooves are etched smooth so that little, if any, electric field distortion occurs along these surfaces.

Figure 5:
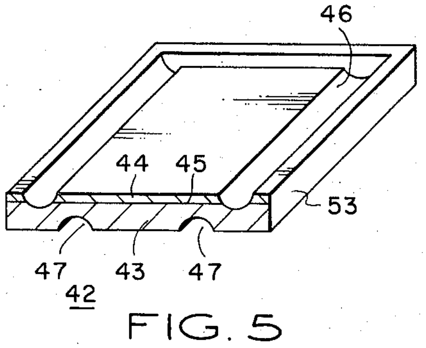
FIG. 5 is a perspective view of a single device separated from the wafer shown in FIG. 3 showing a section cut across one end thereof.

Referring particularly to FIG. 4, the individual devices are separated from the wafer along lines 50 and 52, in this case by sawing. As a result, individual devices are separated out as shown in FIG. 5 (being sectioned on one end as shown). It will be realized that several devices 42', 42'', etc. are produced simultaneously within the wafer, with the various grooves being etched as described with reference to device 42.

Referring particularly to FIG. 5 (and to device 42 between imaginary lines 52), it will be seen that a rough edge 53 is left around the periphery of the device due to sawing the wafer apart to separate out the individual devices. However, the electric field is, for all practical purposes, destroyed at the rough outside edge because of several factors to be discussed.

It is thought that the tortuous path laterally between the two grooves effectively pinches off the electric field, thus substantially destroying it beyond the outside groove. This, however, presupposes that the combined depths of grooves 46 and 47 are very nearly as great as the thickness of the device. As will be seen later, the combined depths of these grooves can also be equal to or greater than the thickness of the device. Thus the electric field encounters a smooth, etched surface substantially throughout the thickness of the wafer.

Grooves 46 and 47 are laterally spaced or offset in order to achieve a greater combined depth of the two without unduly weakening the wafer. That is to say, the device or wafer would be weakened structurally between the two grooves if they are aligned. In addition, the combined depths could not equal or exceed the wafer thickness if the grooves are aligned. As a result of the lateral spacing, more etched surface is made available at the periphery of edge of the device. The lateral spacing distance is not critical so long as the distance is not so small as to structurally weaken the wafer.

Figure 6:
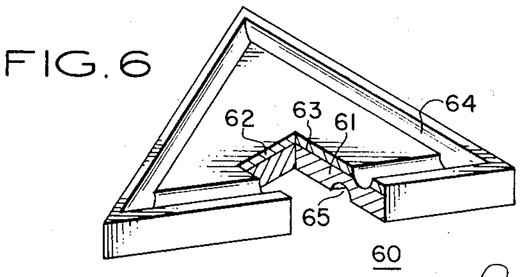
FIG. 6 is a perspective view of a device of different geometry made according to the embodiment shown in FIG. 3, also showing a section therethrough.

The devices shown in FIGS. 3–5 have square geometries, although the particular configuration is immaterial. For example, a device of triangular configuration can be made according to the invention as shown in FIG. 6, or any other geometry as far as that goes. Here, the device 60 is the same except for the geometry, and includes regions 61 and 62 of opposite electrical conductivity types separated by rectifying junction 63. A continuous groove 64 is provided along the periphery in one face of the device, and another groove 65, also continuous, is provided in the other face, spaced inwardly from groove 64.

All of the devices of FIGS. 3–6 are shown with the combined depths of the upper and lower grooves being slightly less than the thickness of the wafer by an amount *d*. The difference *d* is, however, much smaller than the thickness of region 43, for example, to achieve the virtual elimination of electric field distortion.

Figure 7:
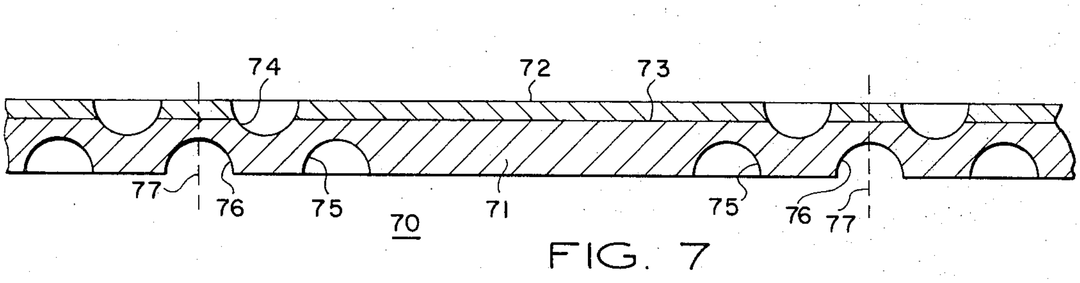
FIG. 7 is a fragmentary side elevational view, in section, of a semiconductor wafer containing several devices made according to another embodiment of the invention.
Figure 8:
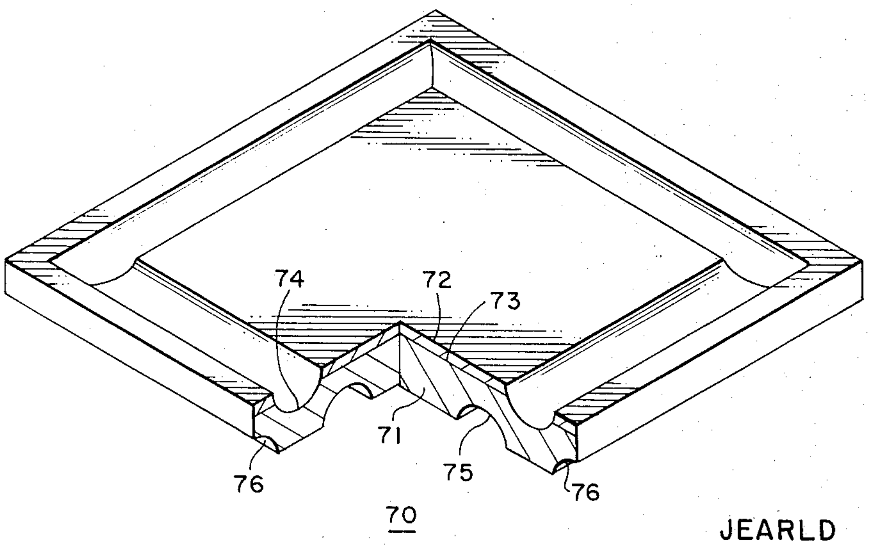
FIG. 8 is a perspective view of a single device separated from the wafer shown in FIG. 7, showing a section therethrough.

Referring now to FIGS. 7 and 8, another embodiment of the invention is shown that is identical to that described so far except the individual devices are separated from the wafer by breaking instead of sawing. A weakened section is preferably provided along the break line, and additional grooves are etched in one face of the wafer to provide the weakened sections. The device 70 of FIGS. 7 and 8 is also a diode having regions 71 and 72 of opposite electrical conductivity tupes separated by rectifying junction 73. Upper and lower, laterally offset grooves 74 and 75 are etched in the wafer as before. In addition, a series of additional grooves 76 are etched in the lower face of the wafer between individual devices to reduce the thickness of the wafer along the break lines. The individual devices are then broken out of the wafer along the break lines 77 to produce an individual device appearing as shown in FIG. 8, wherein this view shows a section broken out so that groove 75 can be more clearly seen. Again, the junction can be glass passivated in groove 74, if desired.

Figure 9:
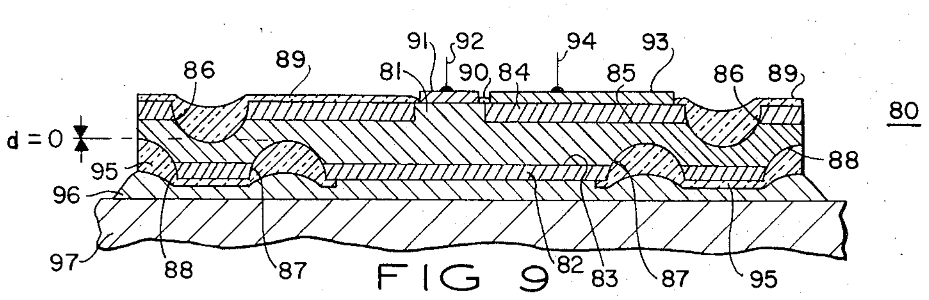
FIG. 9 is a side elevational view, in section, of a device made according to another embodiment of the invention.

Another embodiment of the invention is shown in FIG. 9 in which the combined depths of the upper and lower groove are equal to the depth of the wafer. In addition, a different type of device is illustrated, having more than one rectifying junction. The device 80 includes a relatively high resistivity, wide base region 81 of a first electrical conductivity type, a lower resistivity region 82 of opposite electrical conductivity diffused into region 81 creating a rectifying junction 83 therewith, and another low resistivity region 84 diffused into region 81 from an opposite face of the wafer to create another junction 85 therewith. The drawing represents any device with multiple junctions, wherein there is no attempt to illustrate a particular device.

Upper and lower, laterally spaced apart grooves 86 and 87 are cut in the wafer to completely circumscribe the active junctions. In addition, groove 88 is cut outside of groove 86 along which the device can be separated from the wafer. In this case, however, the combined depth of grooves 86 and 87 are equal to the thickness of the wafer, so that d is equal to zero. The surfaces of the groove are etched smooth, as before. Therefore, an etched surface is provided through the entire thickness of the device at the edge thereof.

Although this device is glass passivated, as will now be described, it should not be construed that glass passivation is necessary, as the invention is applicable regardless.

A first layer 89 of glass is provided in groove 86 to passivate the surface thereof, which layer also covers a part of the top surface of the device. A part 90 of this layer is shown covering junction 85 where the latter is brought to the top surface in planar fashion. A first electrode 91 is attached to region 81 where the latter comes to the top surface, with an electrical lead 92 bonded to this electrode. Another electrode 93 is attached to region 84 at the top surface, with an electrical lead 84 being bonded to this electrode. It is desirable from a practical standpoint to provide a layer of glass over all of the surfaces of the device not occupied by an electrode, as shown.

Another layer 95 of glass is provided on the bottom surface of the device, also covering the surfaces of grooves 87 and 88. The device can be bonded to a metal header 97 through solder 96 acting as an electrode. Again, the glass is provided in the grooves and covers all of the bottom surface not occupied by the electrode. It will be seen here that the glass layer on the bottom surface acts to electrically insulate the header and electrode from predetermined regions of the device.

The layers of glass are provided before the individual devices are broken out of the wafer, as it would be impractical to glass passivate individual devices one at a time. Metal plating (not shown) beneath the electrodes is also provided as a practical matter before the devices are separated. Furthermore, it is better not to break the device out of the wafer along groove 86 (or along groove 74 of FIG. 7), since the glass can be damaged in the groove where the break is made. This damage can take the form of cracks and pin holes through which the junction can become contaminated. However, the junction between grooves 87 and 88 is not activated in the operation of the device. Therefore, it is immaterial whether the glass in groove 88 is damaged during breaking of the wafer, so that groove 88 mechanically isolates the active junction from damage. The glass in groove 88 also aids in breaking the wafer out because of the stresses created when the glass fuses.

For a more detailed discussion of this technologh, reference is had to the copending application of the same inventor entitled SEMICONDUCTOR DEVICE MANUFACTURE WITH JUNCTION PASSIVATION, Ser. No. 872,645, filed Oct. 30, 1969.

Figure 10:
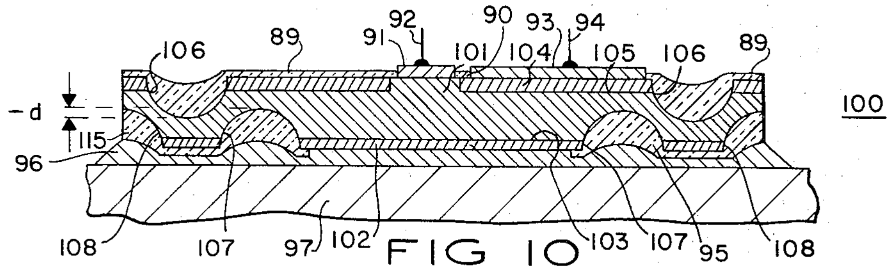
FIG. 10 is a side elevational view, in section, of a device made according to still amother embodiment of the invention.

A further embodiment of the invention is shown in FIG. 10, and represents a device in which the combined depths of the two grooves are greater than the thickness of the wafer. Such an embodiment is highly desirable for devices required to withstand very high reverse voltages, say from between 800 volts to 1,200 volts. For illustrative purposes, the device 100 is shown to have a high resistivity region 101 of a first electrical conductivity type, a first region 102 of opposite type forming a junction 103 with region 101, and another region 104 forming a junction 105 with region 101. Grooves 106 and 107 are again cut in opposite faces of the device, but the depths overlap in region 101 but are laterally offset. In this way, the electric field is virtually destroyed at the edge of the device. Another outer groove 108 is cut in one surface and along with the wafer is broken. All other numerals refer to like parts as shown in FIG. 9.

Figures 11, 12, 14, 15:
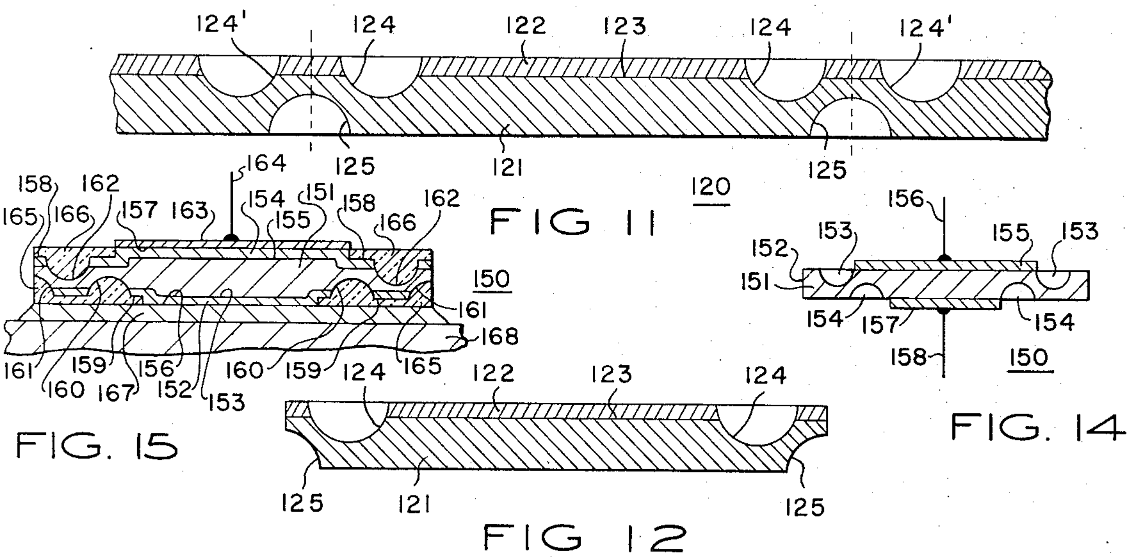
FIG. 11 is a fragmentary side elevational view, in section, of a semiconductor wafer containing several devices made according to a still further embodiment of the invention.
FIG. 12 is a side elevational view, in section, of a single device separated from the wafer shown in FIG. 11.
FIG. 14 is a side elevational view, in section, of a yet further embodiment of the invention.
FIG. 15 is a side elevational view, in section, of another embodiment of the invention.

A variation of the embodiment discussed with reference to FIG. 3 is shown in FIG. 11. A diode or single junction device 120 is illustrated, and includes a first region 121 of one electrical conductivity type adjacent a second region 122 of opposite type with a junction 123 therebetween. Two offset grooves 124 and 125 are again cut in the devices, but in this case, groove 124 along which the junction intersects is inside of groove 125. The wafer is then broken along groove 125. If glass is provided in the grooves for passivation, it is immaterial of it is damaged in groove 125, since no junction intersects this groove. Groove 125 cuts into adjacent devices in the wafer, with grooves 124' and 124'' of additional adjacent devices being shown. The resultant device when separated from the wafer appears as in the end section view of FIG. 12.

Figure 13:
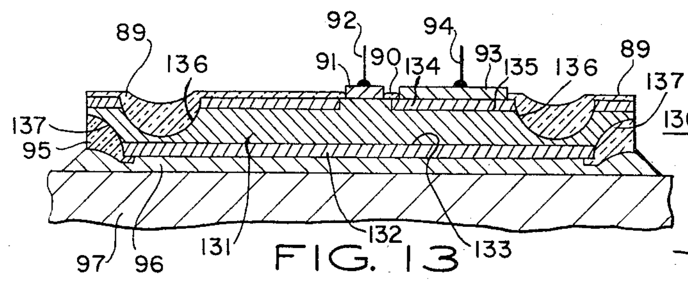
FIG. 13 is a side elevational view, in section, of a different type of device made according to the embodiment shown in FIG. 11.

Although it is preferred to separate the individual device from the wafer along a groove or cut that does not have the active junction intersecting it, the invention is not so limited. For example, the device 130 of FIG. 13 includes a body 131 of one conductivity type having two regions 132 and 134 of opposite types forming junctions 133 and 135 therewith, respectively. Here, both junctions 133 and 135 are active in the operation of the device. Offset grooves 136 and 137 are cut in opposite faces of the device penetrating junctions 135 and 133, respectively. The individual device is separated from the wafer along one of the grooves 137 without cutting an additional outer groove for mechanical isolation purposes. All other numerals refer to like parts as shown in FIG. 9.

All of the embodiments described so far are of devices in which at least one of the continuous grooves has an active rectifying junction intersecting it along the entire length thereof so that the entirety of this junction is circumscribed by the groove. There are instances, however, of devices that do not utilize rectifying junctions, or in which the junctions do not intersect a groove. The same problem is encountered, however, with respect to distortion of the electric field at the rough edge of the device material. Such a device 150 is illustrated in FIG. 15 without specifying any particular device. The device is comprised of a material body 151 having a rough edge 152 about the periphery thereof. Laterally offset grooves 153 and 154 are cut in opposite faces of the body, with the surfaces of the grooves being etched smooth. A first electrode 155 is attached to one surface of the body inside groove 153, with an electrical lead bonded to this electrode. Another electrode 157 is attached to the opposite surface inside of groove 154, with an electrical lead 158 bonded to this electrode. Again, the combined depths of the two grooves is such as to effectively eliminate the distortion of the electric field that otherwise would affect the operation of the device.

Another embodiment that further increases the voltage blocking capability of the device is shown in FIG. 15. The structure of this device permits the use of a thicker layer of glass for passivation purposes and to insulate the device from arcing over at high voltage operation. The device 150 is illustrated as comprising a body 151 of material of a first electrical conductivity type into which am impurity is diffused in one side 156 to form a region 152 of an opposite electrical conductivity type forming a rectifying junction 153 therewith. An impurity is diffused into the opposite side 157 to form another region 154 of opposite electrical conductivity type with body 151 and forming a rectifying junction 155 therewith. These impurities are preferably diffused into the body 151 after the device is etched at its periphery to provide an upper surface 158 in side 157 and lower surface 159 in side 156 completely about the perimeter that are below the major surfaces of the device. For example, these etched surfaces can be from about 0.5 mil to about 1.0 mil below the main surface for a device that is about 8–10 mils thick. Such is an example only and should not be construed as limiting on the invention.

After these surfaces are etched and regions 152 and 154 are created by diffusions, grooves 160 and 161 are etched in surface 159, and groove 162 spaced laterally between these grooves is etched in surface 158. The grooves may have depths and spacings as described earlier, and completely circumscribe the central portion of the device, also as noted earlier. A layer of glass 165 is applied to surface 159 aroung the device so that the upper surface is substantially coplanar with surface 156. Similarly, a layer of glass 166 is applied to surface 158 around the device so that the upper surface is substantially coplanar with surface 157. An electrode 163 is attached to region 154 at surface 157, and an electrical lead 164 is bonded to this electrode. The device is attached mechanically and electrically to a header 168 through solder 167 attached to region 152.

By etching surfaces 158 and 159 below the major surfaces of the device, it is possible to employ glass layers 166 and 165 that are thicker than would ordinarily be practical. This gives better electrical insulation about the periphery of the device to prevent arcing over at higher reverse voltages. This is especially true between the header 168 and surface 159.

Although the invention has been described with reference to particular embodiments thereof, it will be appreciated that many modifications and substitutions that do not depart from the true scope of the invention will undoubtedly occur to those skilled in the art. Accordingly, it is intended that the invention be limited only as defined in the appended claims.

What is claimed is:

1. A semiconductor device comprising:

a. a body of semiconducting material having first and second opposite sides and including layers of opposite semiconductor conductivity type material to form at least one P-N junction,
b. a first continuous groove etched in a surface of said first side which extends through said P-N junction to surround an entire active area,
c. a second continuous groove etched in a surface of said second side spaced laterally from said first groove,
d. the combined depths of said first and said second grooves being substantially as great as the thickness of said body between the surfaces of said first and said second sides, and
e. first and second electrodes attached to said first and second sides laterally inside of said first and said second grooves, respectively, between which a voltage can be applied wherein said first and second grooves operate to prevent electric field distortion within said device.

2. A semiconductor device as set forth in claim 1 wherein the boundary between two of said adjacent layers intersects one of said first and second grooves along the entire length thereof.

3. A semiconductor device as set forth in claim 1 wherein said surface of one of said first and said second sides is etched below a surface adjacent thereto.

4. A semiconductor device as set forth in claim 1 wherein two boundaries between adjacent layers intersect said first and said second grooves, respectively, along the entire lengths thereof.

5. A semiconductor device comprising:
a. a body of semiconductor material having first and second opposite sides,
b. a first continuous groove etched in a surface of said first side,
c. a second continuous groove etched in a surface of said second side spaced laterally inside of said first groove,
d. the combined depths of said first and said second grooves is greater than the thickness of said body between the surfaces of said first and said second sides, and
e. first and second electrodes attached to said first and said second sides laterally inside of said first and said second grooves, respectively, between which a voltage can be applied.

6. A semiconductor device comprising:
a. a body of semiconductor material having first and second opposite sides,
b. a first continuous groove etched in a surface of said first side,
c. a second continuous groove etched in a surface of said second side spaced laterally inside of said first groove,
d. the combined depths of said first and said second grooves being substantially as great as the thickness of said body between the surfaces of said first and said second sides,
e. first and second electrodes attached to said first and said second sides laterally inside of said first and said second grooves, respectively, between which a voltage can be applied, and
f. a rectifying junction intersecting one of said first and second grooves along the entire length thereof, a layer of glass covering the rectifying junction along the length of one of said first and said second grooves.

7. A semiconductor device comprising:
a. a body of semiconductor material having first and second opposite sides,
b. a first continuous groove etched in a surface of said first side,
c. a second continuous groove etched in a surface of said second side spaced laterally inside of said first groove,
d. the combined depths of said first and said second grooves being substantially as great as the thickness of said body between the surfaces of said first and said second sides,
e. first and second electrodes attached to said first and said second sides laterally inside of said first and said second grooves, respectively, between which a voltage can be applied, and
f. a rectifying junction in said body beneath the surface of said first side that intersects said first groove along the entire length thereof, and a third continuous groove cut in the surface of said second side spaced laterally outside of said first groove and intersecting the edge of said body along the entire perimeter thereof.

8. A semiconductor device comprising:
a. a body of semiconductor material having first and second opposite sides,
b. a first continuous groove etched in a surface of said first side,
c. a second continuous groove etched in a surface of said second side spaced laterally inside of said first groove,
d. the combined depths of said first and said second grooves being substantially as great as the thickness of said body between the surface of said first and said second sides,
e. first and second electrodes attached to said first and said second sides laterally inside of said first and said second grooves, respectively, between which a voltage can be applied, and
f. first and second rectifying junctions in said body intersecting said first and second grooves, respectively, along the entire lengths thereof, and a third continuous groove cut in the surface of said second side spaced laterally outside of said first groove and intersecting the edge of said body along the entire perimeter thereof.

9. A semiconductor device comprising:
a. a body of semiconductor material having first and second opposite sides,
b. a first continuous groove etched in a surface of said first side,
c. a second continuous groove etched in a surface of said second side spaced laterally inside of said first groove,
d. the combined depths of said first and said second grooves being substantially as great as the thickness of said body between the surfaces of said first and said second sides,
e. first and second electrodes attached to said first and said second sides laterally inside of said first and said second grooves, respectively, between which a voltage can be applied, and
f. a rectifying junction in said body beneath the surface of said second side that intersects said second groove along the entire length thereof, and said first groove intersects the edge of said body along the entire perimeter thereof.

10. A semiconductor device comprising:

a. a body of semiconductor material having first and second opposite sides, the surface of one of said first and said second sides is etched below a surface adjacent thereto and covered with a layer of glass, b. a first continuous groove etched in a surface of said first side, c. a second continuous groove etched in a surface of said second side laterally inside of said first groove, d. the combined depths of said first and said second grooves being substantially as great as the thickness of said body between the surfaces of said first and said second sides, and e. first and second electrodes attached to said first and said second sides laterally inside of said first and said second grooves, respectively, between which a voltage can be applied.

* * * * *

UNITED STATES PATENT OFFICE

CERTIFICATE OF CORRECTION

Patent No. 3,821,782 Dated June 28, 1974

Inventor(s) Jearld L. Hutson

It is certified that error appears in the above-identified patent and that said Letters Patent are hereby corrected as shown below:

Column 1, line 50, "This is ofter" should read -- This is often --; line 55, "edges" should read -- edge --. Column 2, line 67, "respectively The device" should read -- respectively. The device -. Column 3, line 20, after "magnitudes" "$B_2$ and B3" should read -- $B_2$ and $B_3$ --; line 38, "region having a" should read -- region 32 having a --. Column 5, lines 37 and 38, "inwardly" should read -- inward --. Column 6, line 36, "lead 84" should read -- lead 94 --. Column 7, line 1, "technologh" should read -- technology --; line 5, after "1969" insert -- , now issued as Patent No. 3,608,186, September 28, 1971. --; line 66, "FIG. 15" should read -- FIG. 14 --.

Signed and sealed this 10th day of June 1975.

(SEAL)
Attest:

RUTH C. MASON
Attesting Officer

C. MARSHALL DANN
Commissioner of Patents
and Trademarks